(12) United States Patent
Hong et al.

(10) Patent No.: US 10,461,779 B2
(45) Date of Patent: Oct. 29, 2019

(54) RATE-COMPATIBLE POLAR CODES

(71) Applicant: Telefonaktiebolaget L M Ericsson (publ), Stockholm (SE)

(72) Inventors: Songnam Hong, Cupertino, CA (US); Dennis Hui, Sunnyvale, CA (US); Ivana Marić, Sunnyvale, CA (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 393 days.

(21) Appl. No.: 14/824,694

(22) Filed: Aug. 12, 2015

(65) Prior Publication Data

US 2017/0047947 A1    Feb. 16, 2017

(51) Int. Cl.
     *H03M 13/29*      (2006.01)
     *H04L 1/00*      (2006.01)
     *H03M 13/13*      (2006.01)
     *H03M 13/00*      (2006.01)

(52) U.S. Cl.
     CPC ....... *H03M 13/2906* (2013.01); *H03M 13/13* (2013.01); *H03M 13/6368* (2013.01); *H04L 1/0041* (2013.01); *H04L 1/0064* (2013.01); *H04L 1/0067* (2013.01)

(58) Field of Classification Search
     CPC .......... H03M 13/2906; H03M 13/617; H03M 13/157; H03M 13/09; H03M 13/13; H03M 13/451; H03M 13/611; H03M 13/6561; H04L 1/0041; H04L 1/0064; H04L 1/0067
See application file for complete search history.

(56) References Cited

U.S. PATENT DOCUMENTS

| | | | | |
|---|---|---|---|---|
| 8,347,186 B1 * | 1/2013 | Arikan | .................. | H03M 13/13 |
| | | | | 714/774 |
| 9,467,164 B2 * | 10/2016 | Ionita | .................. | H04L 25/4917 |
| 2005/0149841 A1 | 7/2005 | Kyung et al. | | |
| 2014/0208183 A1 * | 7/2014 | Mahdavifar | ........ | H03M 13/296 |
| | | | | 714/755 |
| 2016/0013810 A1 * | 1/2016 | Gross | .................... | H03M 13/09 |
| | | | | 714/776 |

OTHER PUBLICATIONS

Eslami, Ali, et al., "A Practical Approach to Polar Codes," IEEE International Symposium on Information Theory Proceedings, Jul. 31-Aug. 5, 2011, IEEE, pp. 16-20.

Niu, Kai, et al., "Beyond Turbo Codes: Rate-Compatible Punctured Polar Codes," IEEE International Conference on Communications (ICC), Jun. 9-13, 2013, IEEE, pp. 3423-3427.

(Continued)

*Primary Examiner* — Kyle Vallecillo
(74) *Attorney, Agent, or Firm* — Sage Patent Group

(57) ABSTRACT

Systems and methods are disclosed herein relating to rate-compatible polar codes and the use thereof in a wireless communications system. In some embodiments, a transmit node operable for use in a wireless communications system comprises a rate-compatible polar encoder operable to encode information bits to provide coded bits utilizing parallel concatenated polar codes. The transmit node further comprises a transmitter operable to transmit the plurality of coded bits. In this manner, the transmit node may, in some embodiments, use polar codes having different coding rates to adapt to time-varying channel conditions.

25 Claims, 11 Drawing Sheets

(56) References Cited

OTHER PUBLICATIONS

Niu, Kai, et al., "Polar Codes: Primary Concepts and Practical Decoding Algorithms," IEEE Communications Magazine, vol. 52, Issue 7, Jul. 2014, IEEE, pp. 192-203.
Trifonov, Peter, "Efficient Design and Decoding of Polar Codes," IEEE Transactions on Communications, vol. 30, Issue 11, Nov. 2012, IEEE, pp. 3221-3227.
Wang, Fang, et al., "Design and Code Optimization of Parallel Concatenated Gallager Codes," 18th Annual IEEE International Symposium on Personal, Indoor and Mobile Radio Communications (PIMRC'07), Sep. 3-7, 2007, IEEE, 5 pages.
Wen, Hong, et al., "Cooperative Coding Using Parallel Concatenated LDPC Codes," Proceedings of 2006 IEEE Information Theory Workshop (ITW'06), Oct. 22-26, 2006, IEEE, pp. 395-398.
International Search Report and Written Opinion for International Patent Application No. PCT/IB2016/053941, dated Oct. 18, 2016, 16 pages.
Arikan, Erdal, "Channel Polarization: A Method for Constructing Capacity-Achieving Codes for Symmetric Binary-Input Memoryless Channels," IEEE Transactions on Information Theory, vol. 55, Issue 7, Jul. 2009, IEEE, pp. 3051-3073.
Korada, Satish Babu, "Polar Codes for Channel and Source Coding," Thesis for the Doctoral Program in Computer, Communications and Information for Obtaining the Rank of Doctor of Science, Jul. 2009, Federal Polytechnic School of Lausanne, 181 pages.
Tal, Ido, et al., "How to Construct Polar Codes," IEEE Transactions on Information Theory, vol. 59, Issue 10, Oct. 2013, IEEE, pp. 6562-6582.
Tal, Ido, et al., "List Decoding of Polar Codes," IEEE Transactions on Information Theory, Jul. 31-Aug. 5, 2011, St. Petersburg, Florida, IEEE, pp. 1-14.

\* cited by examiner

RATE-COMPATIBLE POLAR CODES

TECHNICAL FIELD

The present disclosure relates to polar codes and, in particular, rate-compatible polar codes and the use thereof for error correction coding in a wireless communications system.

BACKGROUND

Polar codes, proposed by E. Arikan, "Channel Polarization: A Method for Constructing Capacity-Achieving Codes for Symmetric Binary-Input Memoryless Channels," IEEE Transactions on Information Theory, Vol. 55, Issue 7, pages 3051-3073, July 2009, are the first class of constructive coding schemes that are provable to achieve symmetric capacity of binary-input discrete memoryless channels under a low-complexity Successive Cancellation (SC) decoder. However, the finite-length performance of polar codes under SC is not competitive over other modern channel coding schemes, such as Low-Density Parity-Check (LDPC) codes and turbo codes. Later, a SC List (SCL) decoder was proposed in I. Tal et al., "List Decoding of Polar Codes," 2011 IEEE International Symposium on Information Theory Proceedings, pages 1-5, Jul. 31-Aug. 5, 2011. The proposed SCL decoder can approach the performance of an optimal Maximum-Likelihood (ML) decoder. By concatenating a simple Cyclic Redundancy Check (CRC) coding, it was shown that the performance of a concatenated polar code is better than the performance of well-optimized LDPC and turbo codes. This result represents the breakthrough of polar codes in future wireless communications systems (i.e., 5th Generation (5G)).

Wireless broadband systems require flexible and adaptive transmission techniques since they operate in the presence of time-varying channels. For such systems, Hybrid Automatic Repeat Request (HARQ) based on Incremental Redundancy (HARQ-IR) schemes are often used, where parity bits are sent in an incremental fashion depending on the quality of the time-varying channel. IR systems require the use of rate-compatible punctured codes. According to the rate requirement, an appropriate number of parity bits are sent by the transmitter. Here, the set of parity bits of a higher rate code should be a subset of the set of parity bits of a lower rate code. Therefore, in a HARQ-IR system, if the receiver fails to decode at a particular rate, the receiver only needs to request additional parity bits from the transmitter. For this reason, there has been extensive research on the construction of rate-compatible turbo codes and LDPC codes.

Although polar codes can achieve the capacity of a binary input symmetric output channel, existing polar codes are not rate-compatible and, as such, are not suitable for use in a future wireless communications system, particularly one that utilizes HARQ-IR or some similar IR transmission scheme.

SUMMARY

Systems and methods are disclosed herein relating to rate-compatible polar codes and the use thereof in a wireless communications system. In some embodiments, a transmit node operable for use in a wireless communications system comprises a rate-compatible polar encoder operable to encode information bits to provide coded bits utilizing parallel concatenated polar codes. The transmit node further comprises a transmitter operable to transmit the plurality of coded bits. In this manner, the transmit node may, in some embodiments, use polar codes having different coding rates to adapt to time-varying channel conditions.

In some embodiments, the rate-compatible polar encoder comprises multiple polar encoders operable to encode the information bits. The polar encoders comprise a first polar encoder operable to encode the information bits at a first code rate $r_1$ to provide a number $n_1$ of coded bits, where $n_1 = k/r_1$ and k is the number of information bits; and a second polar encoder operable to encode a subset of the information bits at a second code rate $r_2$ to provide a number $n_2$ of coded bits, where $r_1 > r_2$ and the number $n_2$ of coded bits is a number of coded bits that, when concatenated with the number $n_1$ of coded bits, transforms a resulting code word from the first code rate $r_1$ to the second code rate $r_2$. The coded bits are provided at a desired code rate $r_{desired}$ and are a concatenation of the coded bits output by polar encoders of the plurality of polar encoders for rates $r_1$ through $r_{desired}$. Further, in some embodiments, the rate-compatible polar encoder further comprises a concatenator operable to concatenate the coded bits output by the polar encoders for rates $r_1$ through $r_{desired}$ to provide the plurality of coded bits at the desired code rate $r_{desired}$.

In some embodiments, the rate-compatible polar encoder comprises multiple polar encoders operable to encode the information bits based on corresponding polar code generator matrices for rates $r_i$ and lengths $n_i$, where:

$i = \{1, \ldots, T\}$, where T is a positive integer greater than or equal to 2;

$n_1$ is a length for code rate $r_1$ and, for all other values of i, $n_i$ is a number of additional coded bits to transform a code word for code rate $r_{i-1}$ into a code word for code rate $r_i$, i.e., $$n_i = \begin{cases} \dfrac{k}{r_i}, & \text{for } i = 1 \\ \dfrac{k}{r_i} - \sum_{j=1}^{i-1} n_j, & \text{for } i > 1 \end{cases}$$

where k is the number of information bits i;

$\sum_{i=1}^{T} n_i = n$, where n is a maximum code word length of the coded bits (i.e., $n = k/n_T$); and $r_i > r_{i+1}$ for $i = 1, \ldots, T-1$.

The coded bits are provided at a desired code rate $r_{desired}$ and are a concatenation of the coded bits output by polar encoders for code rates $r_1$ through $r_{desired}$. Further, in some embodiments, the rate-compatible polar encoder further comprises a concatenator operable to concatenate outputs of the polar encoders to provide the coded bits at the desired code rate $r_{desired}$ such that, for the desired code rate $r_{desired}$, the coded bits are a concatenation of the outputs of the polar encoders for code rates $r_1, \ldots, r_{desired}$. Further, in some embodiments, the polar code generator matrices for the polar encoders are submatrices $G_{n_i}^{A_i}([1:r_i n_i])$ of row-permuted generator matrices of i-th polar codes $G_{n_i}^{A_i}$ consisting of rows 1 through $r_i n_i$ of $G_{n_i}^{A_i}$.

In some embodiments, the polar encoders comprise a first polar encoder for code rate $r_1$ operable to encode the information bits at the code rate $r_1$ to provide $n_1$ coded bits, and one or more additional polar encoders, each additional polar encoder operable to encode a subset of the information bits consisting of a number $r_i n_i$ of the information bits at the code rate $r_i$ to provide $n_i$ coded bits. In some embodiments, for each of the one or more additional polar encoders, the subset of the information bits encoded by the additional polar encoder is different than the subsets encoded by the other additional polar encoders. In other embodiments, for each of the one or more additional polar encoders, the subset of the information bits encoded by the additional polar encoder comprises a predefined number of the information bits that are most unreliable with respect to transmission of the number $n_1$ of coded bits from the first polar encoder. In some embodiments, for at least one of the one or more additional polar encoders, an ordering of the subset of the information bits encoded by the at least one of the one or more additional polar encoders is different than an ordering of those same information bits when encoded by the first polar encoder.

In some embodiments, the transmit node further comprises at least one processor, memory containing instructions executable by the at least one processor whereby the transmit node is further operable to: select an initial code rate; perform, via the rate-compatible polar encoder, polar encoding of the information bits at the initial code rate; transmit, via the transmitter, the coded bits, having been encoded at the initial code rate; select a new code rate for an incremental redundancy retransmission upon receiving a negative acknowledgement from a receive node for the transmission of the coded bits; perform, via the rate-compatible polar encoder, polar encoding of some of the information bits to provide additional coded bits for the new code rate; and transmit, via the transmitter, the additional coded bits. Further, in some embodiments, the rate-compatible polar encoder comprises multiple polar encoders operable to encode the information bits based on corresponding polar code generator matrices for code rates $r_i$ and lengths $n_i$, where:

i={1, . . . , T}, where T is a positive integer greater than or equal to 2;
$n_1$ is a length for code rate $r_1$ and, for all other values of i, $n_i$ is a number of additional coded bits to transform a code word for code rate $r_{i-1}$ into a code word for code rate $r_i$, i.e., $$n_i = \begin{cases} \dfrac{k}{r_i}, & \text{for } i = 1 \\ \dfrac{k}{r_i} - \sum_{j=1}^{i-1} n_j, & \text{for } i > 1 \end{cases}$$

where k is a number of information bits i;
$\sum_{i=1}^{T} n_i = n$, where n is a maximum code word length of the coded bits (i.e., $n=k/n_T$); and
$r_i > r_{i+1}$ for i=1, . . . , T-1.

The coded bits are provided at the initial code rate $r_{initial}$ and are a concatenation of the coded bits output by polar encoders for code rates $r_1$ through $r_{initial}$. Further, in some embodiments, the rate-compatible polar encoder further comprises a concatenator operable to selectively concatenate outputs of the polar encoders to provide the coded bits at an initial code rate $r_{initial}$ such that, for the initial code rate $r_{initial}$, the coded bits are a concatenation of the outputs of the polar encoders for code rates $r_1, \ldots, r_{desired}$.

In some embodiments, the additional coded bits for a new code rate $r_{new}$ are a concatenation of the outputs of the polar encoders for code rates $r_{initial+1}, \ldots, r_{new}$, where $r_{new} \geq r_{initial+1}$.

Embodiments of a method of operation of a transmit node in a wireless communications system are also disclosed.

In some embodiments, a receive node operable for use in a wireless communications system comprises a receiver operable to receive coded bits and a rate-compatible polar decoder operable to decode the coded bits to provide information bits.

In some embodiments, in order to decode the coded bits, the rate-compatible polar decoder is operable to: determine a code rate $r_d$ of the coded bits, the code rate $r_d$ being one of a predefined set of code rates $\{r_i\}_{i=1,\ldots,T}$ where $r_i > r_{i+1}$ for i=1, . . . ,T-1 and T is a positive integer greater than or equal to 2; and successively perform polar decoding of the last $n_i$ coded bits of the coded bits for code rates $r_d$ to $r_1$ to provide sets of information bits for the code rates $r_d$ to $r_1$, respectively, where:

$$n_i = \begin{cases} \dfrac{k}{r_i}, & \text{for } i = 1 \\ \dfrac{k}{r_i} - \sum_{j=1}^{i-1} n_j, & \text{for } i > 1 \end{cases};$$

k is a number of information bits encoded into the coded bits; and
$r_i > r_{i+1}$ for i=1, . . . ,T, where $r_T$ is a lowest code rate.

The rate-compatible polar decoder is further operable to concatenate the sets of information bits for the code rates $r_d$ to $r_1$ to provide the information bits.

In some embodiments, in order to successively perform polar decoding of the last $n_i$ coded bits of the coded bits for code rates $r_d$ to $r_1$ to provide the sets of information bits for the code rates $r_d$ to $r_1$, respectively, the rate-compatible polar decoder is further operable to: perform polar decoding of the last $n_d$ coded bits for code rate $r_d$ to provide the set of information bits for code rate $r_d$; perform polar decoding of the next $n_{d-1}$ coded bits using the set of information bits for code rate $r_d$ as frozen bits to provide the set of information bits for code rate $r_{d-1}$; and perform polar decoding of the next $n_{d-2}$ coded bits using the union of the sets of information bits for code rates $r_d$ and $r_{d-1}$ as frozen bits to provide the set of information bits for code rate $r_{d-2}$.

Those skilled in the art will appreciate the scope of the present disclosure and realize additional aspects thereof after reading the following detailed description of the embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
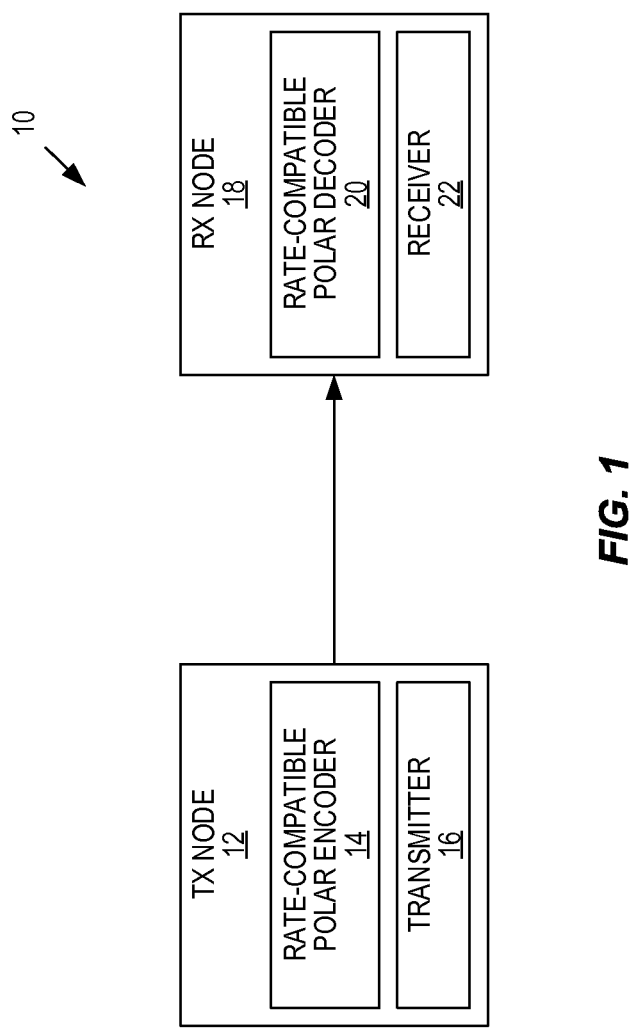
FIG. 1 illustrates a wireless communications system in which rate-compatible polar codes are utilized according to some embodiments of the present disclosure.

Systems and methods are disclosed herein relating to rate-compatible polar codes and the use thereof in a wireless communications system. In this regard, FIG. 1 illustrates a wireless communications system 10 including a transmit (TX) node 12 that includes a rate-compatible polar encoder 14 and a transmitter 16, and a receive (RX) node 18 that includes a rate-compatible polar decoder 20 and a receiver 22. The wireless communications system 10 may be any type of wireless communications system such as, but not limited to, a cellular communications network in which the transmit node 12 is, e.g., a radio access node (e.g., a base station) and the receive node 18 is a wireless device or terminal (e.g., a User Equipment device (UE)), or vice versa.

Before describing the operation of the wireless communications system 10 and, in particular, the operation of the rate-compatible polar encoder 14 and the rate-compatible polar decoder 20, a discussion of a family of rate-compatible polar codes is first provided. The family of rate-compatible polar codes is used to encode k information bits with various code rates $\{r_i: i=1, \ldots, T\}$, where $r_1 > \ldots > r_T$ and $T \geq 2$. The disclosed rate-compatible polar code satisfies the condition that the set of parity bits of a higher rate code should be a subset of the set of parity bits of a lower rate code, which can be used for Hybrid Automatic Repeat Request (HARQ) based on Incremental Redundancy (HARQ-IR) systems.

Let $G_{mother}$ denote a k×n polar code generator matrix of the mother code with lowest code rate $r_T$, where $n=k/r_T$. For given information bits $(u_1, \ldots, u_k)$, the corresponding codeword for the lowest code rate $r_T$ is generated as:

$$(u_1, \ldots, u_k) G_{mother} = (x_1, \ldots, x_n).$$

The codeword of a higher-rate code with code rate $r_i$ is simply obtained by taking the first $n_i'=k/r_i$ bits such as $(x_1, \ldots, x_{n_i'})$, equivalently puncturing the last $n-n_i'$ bits from the mother code's codeword $(x_1, \ldots, x_n)$.

In the present disclosure, a polar code generator matrix $G_{mother}$ (oftentimes referred to herein simply as a generator matrix $G_{mother}$) is constructed of a rate-compatible polar code where each punctured polar code of a higher rate is also capacity achieving under a low-complexity Successive Cancellation (SC) decoding when code length n goes to infinity. As discussed below, the rate-compatible polar encoder 14 operates to encode k information bits according to a desired code rate according to the generator matrix $G_{mother}$.

In the following discussion, the generator matrix $G_{mother}$ is described with respect to an example of a rate-compatible polar code that can be used to encode k information bits and supports three code rates $\{r_1, r_2, r_3\}$, where $r_1 > r_2 > r_3$. This is then extended into a more general case with various rates $\{r_i: i=1, \ldots, T\}$, where $r_1 > \ldots > r_T$.

Let $G_N$ denote a generator matrix (which is also referred to herein as a polar code generator matrix) of polar code with code length N. $G_N$ is a deterministic matrix, as defined in E. Arikan, "Channel Polarization: A Method for Constructing Capacity-Achieving Codes for Symmetric Binary-Input Memoryless Channels," IEEE Transactions on Information Theory, Vol. 55, Issue 7, pages 3051-3073. July 2009 (hereinafter "Arikan"). Specifically, let $$G = \begin{bmatrix} 1 & 0 \\ 1 & 1 \end{bmatrix}.$$

Then, $G_N$ can be defined as $G^{\otimes n}$, where $\otimes n$ denotes the $n^{th}$ Kronecker power and $N=2^n$. A polar code with length N and rate r is completely defined by $G_N$ and an information set A with $|A|=Nr$. Here, the information set A determines the locations (i.e., rows of the generator matrix $G_N$) to be used for the information bits in the input of polar encoding. The rows of the generator matrix $G_N$ that are not to be sued for the information bits are referred to as locations of "frozen bits." Conversely, the rows of the generator matrix $G_N$ that are to be used for the information bits are referred to as locations of "unfrozen bits" or the locations of the information bits. Following the conventional notation of coding theory, a k×N generator matrix of a polar code is also defined by simply taking the rows of $G_N$ corresponding to A, where all frozen bits are assumed to be zero. It is assumed that that the first k' indices of A is again an information set of polar code of rate k'/n, which can be easily obtained by ordering indices of A (see, for example, S. B. Korada, "Polar Codes for Channel and Source Coding," PhD Thesis, École Polytechnique Fédérale de Lausanne, 2009 (hereinafter "Korada")). For a given information set A, $G_N^A$ is defined as a row-permuted matrix of $G_N$ with the same size such that all rows of $G_N$ whose indices belong to A are located in the first $|A|$ rows of $G_N^A$, i.e., the i-th row of $G_N^A$ is equal to the A(i)-th row of $G_N$, where A(i) denotes the i-th element of A. Notice that $G_N^A$ is also a generator matrix of a polar code of length N. For an index subset $D \subset [1:N]$, $G_N^A(D)$ denotes a submatrix of $G_N^A$ consisting of rows whose indices belong to D.

Letting $k=r_3n$, one example of the k×n generator matrix $G_{mother}$ has the form of:

$$G_{mother} = \begin{bmatrix} & 0_{r_2 n_1 \times n_2} & 0_{r_3 n_1 \times n_3} \\ G_{n_1}^{A_1}([1:r_1 n_1]) & & G_{n_3}^{A_3}([1:r_3 n_{(3,1)}]) \\ & G_{n_2}^{A_2}([1:r_2 n_2]) & 0_{n_{(3,12)} \times n_3} \\ & & G_{n_3}^{A_3}\left(\begin{bmatrix} r_3 n_{(3,1)}+1:r_3 n_{(3,1)}+ \\ r_3 n_{(3,2)} \end{bmatrix}\right) \end{bmatrix},$$

where $A_1$ denotes the information set of a polar code of code rate $r_1$ and length $$n_1 = \frac{k}{r_1} = (r_3/r_1)n,$$

$A_2$ denotes the information set of a polar code of code rate $r_2$ and length $$n_2 = \frac{k}{r_2} - n_1 = (r_1 - r_2)n_1/r_2,$$

$A_3$ denotes the information set of a polar code of code rate $r_3$ and length $$n_3 = \frac{k}{r_3} - n_1 - n_2 = \frac{k}{r_3} - \frac{k}{r_2} = (r_2 - r_3)n_2/r_3,$$

and where $$n_{(3,1)} = \frac{r_2}{r_3}n_1 - n_1, \; n_{(3,2)} = \frac{r_2}{r_3}n_2 - n_2, \text{ and } n_{(3,12)} = r_3 n_2.$$

It can be confirmed that $G_{mother}$ is indeed the k×n generator matrix since $$r_1 n_1 = k \text{ and } n_1 + n_2 + n_3 = n.$$

For the convenience of notation, the above generator matrix $G_{mother}$ can be represented by $$G_{mother} = [S_1 S_2 S_3]$$

Here, $S_i$ is a k×$n_i$ matrix with $$n_i = \frac{k}{r_i} - \sum_{j=1}^{i-1} n_j,$$

and $$S_1 = G_{n_1}^{A_1}([1:r_1 n_1]),$$

$$S_2 = \begin{bmatrix} 0_{r_2 n_1 \times n_2} \\ G_{n_2}^{A_2}([1:r_2 n_2]) \end{bmatrix}, \text{ and}$$

$$S_3 = \begin{bmatrix} 0_{r_3 n_1 \times n_3} \\ G_{n_3}^{A_3}([1:r_3 n_{(3,1)}]) \\ 0_{n_{(3,12)} \times n_3} \\ G_{n_3}^{A_3}([r_3 n_{(3,1)} + 1 : r_3 n_{(3,1)} + r_3 n_{(3,2)}]) \end{bmatrix}.$$

Notice that the information sets $A_1$, $A_2$, and $A_3$ can be obtained from an efficient algorithm in I. Tal et al., "How to Construct Polar Codes," IEEE Transactions on Information Theory, Vol. 59, Issue 10, Jul. 10, 2013, pages 6562-6582 (hereinafter "Tal").

In addition, a specific generator matrix can be defined for each punctured polar code (i.e., for each rate $r_i$) as follows:

rate $r_1$: $G_{r_1} = [S_1]$;
rate $r_2$: $G_{r_2} = [S_1 \; S_2]$ and
rate $r_3$: $G_{r_2} = [S_1 \; S_2 \; S_3]$.

Therefore, encoding and decoding for each of the code rates can be performed according to the above shortened matrices derived from the generator matrix $G_{mother}$.

Notably, in the example above, $S_1$ can be used to encode all k information bits to provide $n_1$ coded bits, $S_2$ can be used to encode $r_2 n_2$ of the k information bits (specifically, in this example, the last $r_2 n_2$ bits of the k information bits) to provide $n_2$ coded bits, and $S_3$ can be used to encode $r_3 n_3$ of the k information bits (specifically, in this example, the last $r_3 n_{(3,2)}$ bits of the k information bits and an additional subset of $r_3 n_{(3,1)}$ bits of the k information bits) to provide $n_3$ coded bits. The coded bits resulting from $S_1$ can be used to provide a code word for code rate $r_1$, the concatenation of the coded bits resulting from $S_1$ and $S_2$ can be used to provide a code word for code rate $r_2$, and the concatenation of the coded bits resulting from $S_1$, $S_2$ and $S_3$ can be used to provide a code word for code rate $r_3$.

Importantly, $S_2$ and $S_3$ of the example generator matrix $G_{mother}$ above are only examples. In this example, $S_2$ includes the polar code matrix $G_{n_2}^{A_2}([1:r_2 n_2])$ for code rate $r_2$, which is used to encode the last $r_2 n_2$ bits of the k information bits since, in this example, the rows of $G_{n_1}^{A_1}([1:r_1 n_1])$ are sorted according to channel quality and, therefore, the reliability of successful reception of the corresponding information bits). Therefore, if the goal of $S_2$ is to retransmit the $r_2 n_2$ most unreliable information bits, then, in this example, $S_2$ is designed to retransmit the last $r_2 n_2$ bits of the k information bits. However, in other implementations, it may be desirable to transmit some other set of $r_2 n_2$ bits of the k information bits for code rate $r_2$, in which case $G_{n_2}^{A_2}([1:r_2 n_2])$ can be properly positioned within $S_2$ so as to retransmit the desired set of $r_2 n_2$ bits of the k information bits for code rate $r_2$. Similarly, in the example above, $S_3$ is designed to retransmit the last $r_3 n_{(3,2)}$ bits of the k information bits and additionally retransmit some subset of $r_3 n_{(3,1)}$ bits of the k information bits that were not retransmitted for code rate $r_2$. However, again, $S_3$ may be designed to retransmit any $r_3 n_3$ bits of the k information bits.

In the example above, the generator matrix $G_{mother}$ is described with respect to an example having three code rates. However, more generally, given a sequence of rates $\{r_i, i=1, \ldots, T\}$ sorted in a descending order, i.e., $r_1 > r_2 > \ldots > r_T$, and k information bits to be communicated, the transmitter can transmit a sequence of polar codes to achieve each of these rates. Here, T is greater than or equal to 2. Following the expression in (1), the generator matrix $G_{mother}$ is represented by $$G_{mother} = [S_1 S_2 \ldots S_T]$$

where $S_i$ is a k×$r_i n_i$ matrix which can be obtained from the row-permuted generator matrix of i-th polar code denoted by $G_{n_i}^{A_i}$. The i-th polar code in the sequence has a block length $$n_i = \frac{k}{r_i} - \sum_{j=1}^{i-1} n_j,$$

for i=1, . . . ,T, such that the total block length is given by $$n = \sum_{i=1}^{T} n_i = \frac{k}{r_T}.$$

The number of unfrozen rows (bits) in the i-th polar code is given by $$n_i r_i = k - r_i \sum_{j=1}^{i-1} n_j = r_{i-1} \sum_{j=1}^{i-1} n_j - r_i \sum_{j=1}^{i-1} n_j = \sum_{j=1}^{i-1} q_j^{(i)}$$

where $$q_j^{(i)} = n_j(r_{i-1} - r_i)$$

denotes the share of these unfrozen bits that is transmitted to convert the j-th polar code constructed previously (for $1 \leq j < i$) from code rate $r_{i-1}$ to $r_i$. Notice that in the previous process, the rate of the j-th polar code has been already converted into the code rate $r_{i-1}$. We define the locations of these $n_i r_i$ unfrozen bits in $G_{mother}$ recursively as follows. Assume that we are given $\{G_{n_j}^{A_j}\}_{j=1}^T$ with the rows of each $G_{n_j}^{A_j}$ sorted according to the mutual informations of the corresponding bit channels of the jth polar code. Suppose that we have the submatrices $\{S_j\}_{j=1}^i$ of $G_{mother}$ up to the ith polar code for some $i \geq 1$, and the corresponding index mapping $h^{(j)}$: $\{1, 2, \ldots, n_j r_j\} \rightarrow \{1, 2, \ldots, k\}$ that specifies the indices the non-zero rows of $S_1$ containing the unfrozen rows of $G_{n_j}^{A_j}$ $(1:n_j r_j)$, for all $j=1,2,\ldots, i$, with $h^{(1)}(\cdot)$ simply defined as $h^{(1)}(m)=m$ for $m=1, 2, \ldots, k$. With $q_0^{(i+1)} \triangleq 0$, define the interval $$I_j^{(i+1)} \triangleq \{Q_{j-1}^{(i+1)}+1, Q_{j-1}^{(i+1)}+2, \ldots, Q_{j-1}^{(i+1)}+q_j^{(i+1)}\}$$

where $$Q_{j-1}^{(i+1)} = \sum_{l=1}^{j-1} q_l^{(i+1)}$$

for $j=1, 2, \ldots, i$, such that $\{I_j^{(i+1)}\}_{j=1}^i$ forms a partition of the integer set $$\{1, 2, \ldots, n_{i+1} r_{i+1}\} = \bigcup_{j=1}^{i} I_j^{(i+1)}$$

The index mapping can now be defined as $h^{(i+1)}$: $\{1, 2, \ldots, n_{i+1} r_{i+1}\} \rightarrow \{1, 2, \ldots, k\}$ for $S_{i+1}$ in a piece-wise fashion as $$h^{(i+1)}(m) = h^{(j_m)}\left(m - Q_{j_m-1}^{(i+1)} + n_{j_m} r_{j_m} - \sum_{l=j_m+1}^{i+1} q_{j_m}^{(l)}\right)$$

for $m=1, 2, \ldots, n_{i+1} r_{i+1}$, where $j_m$ denotes the index of the interval $I_{j_m}^{(i+1)}$ that contains the integer m.

An optional permutation mapping $\pi^{(i+1)}$: $\{1, 2, \ldots, n_{i+1} r_{i+1}\} \rightarrow \{1, 2, \ldots, n_{i+1} r_{i+1}\}$ may also be combined with $h^{(i+1)}(m)$ to obtain $$h^{(i+1)}(m) = h^{(j_{\pi^{(i+1)}(m)})}\left(\pi^{(i+1)}(m) - \right.$$

$$\left. Q_{j_{\pi^{(i+1)}(m)}-1}^{(i+1)} + n_{j_{\pi^{(i+1)}(m)}} r_{j_{\pi^{(i+1)}(m)}} - \sum_{l=j_{\pi^{(i+1)}(m)}+1}^{i+1} q_{j_{\pi^{(i+1)}(m)}}^{(l)}\right)$$

in order to allow different mappings of the unfrozen rows (or bits) of $G_{n_{i+1}}^{A_{i+1}}$ to the previously constructed polar codes. Examples of $\pi^{(i+1)}(\cdot)$ includes the identity mapping $\pi^{(i+1)}(m)=m$, and the reverse mapping $\pi^{(i+1)}(m)=n_{i+1}r_{i+1}-m+1$ for $m=1, 2, \ldots, n_{i+1} r_{i+1}$.

Figure 2:
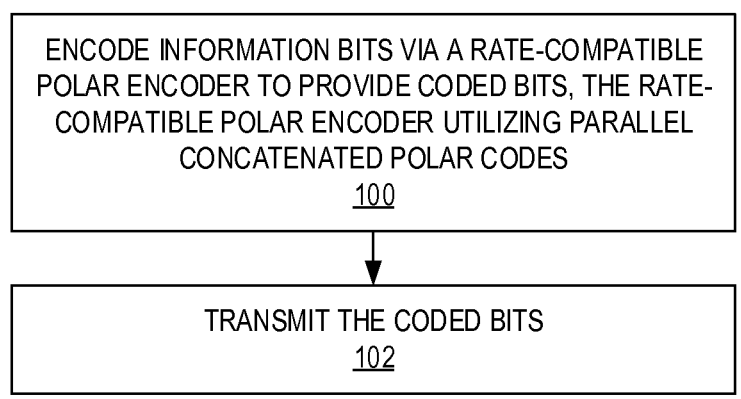
FIG. 2 is a flow chart that illustrates the operation of the transmit node of FIG. 1 according to some embodiments of the present disclosure.

Now that the rate-compatible polar code generator matrix $G_{mother}$ has been described, FIG. 2 illustrates the operation of the transmit node 12 of FIG. 1 according to some embodiments of the present disclosure. As illustrated, the transmit node 12, and in particular the rate-compatible polar encoder 14, encodes the k information bits for a desired code rate $r_1$ to provide $n_{r_1}$ coded bits (step 100). The rate-compatible polar encoder 14 performs rate-compatible polar encoding using parallel concatenated polar codes. In particular, using code rate $r_2$ as an example, the rate-compatible polar encoder 14 performs polar encoding of the k information bits according to:

$(u_1, \ldots, u_k)[S_1 S_2] = (x_1, \ldots, x_{n_1+n_2})$.

In other words, the k information bits are encoded according to $S_1$ to provide a first polar code (i.e., $n_1$ coded bits in the form of a first polar code). The k information bits are also encoded according to $S_2$ to provide a second polar code (i.e., $n_2$ coded bits in the form of a second polar code). These first and second polar codes are concatenated to provide a polar code of length $n_1+n_2$. This polar code is the $n_1+n_2$ coded bits (i.e., the codeword) for code rate $r_2$. The transmit node 12, and in particular the transmitter 16, transmits the coded bits (step 102).

Figure 3:
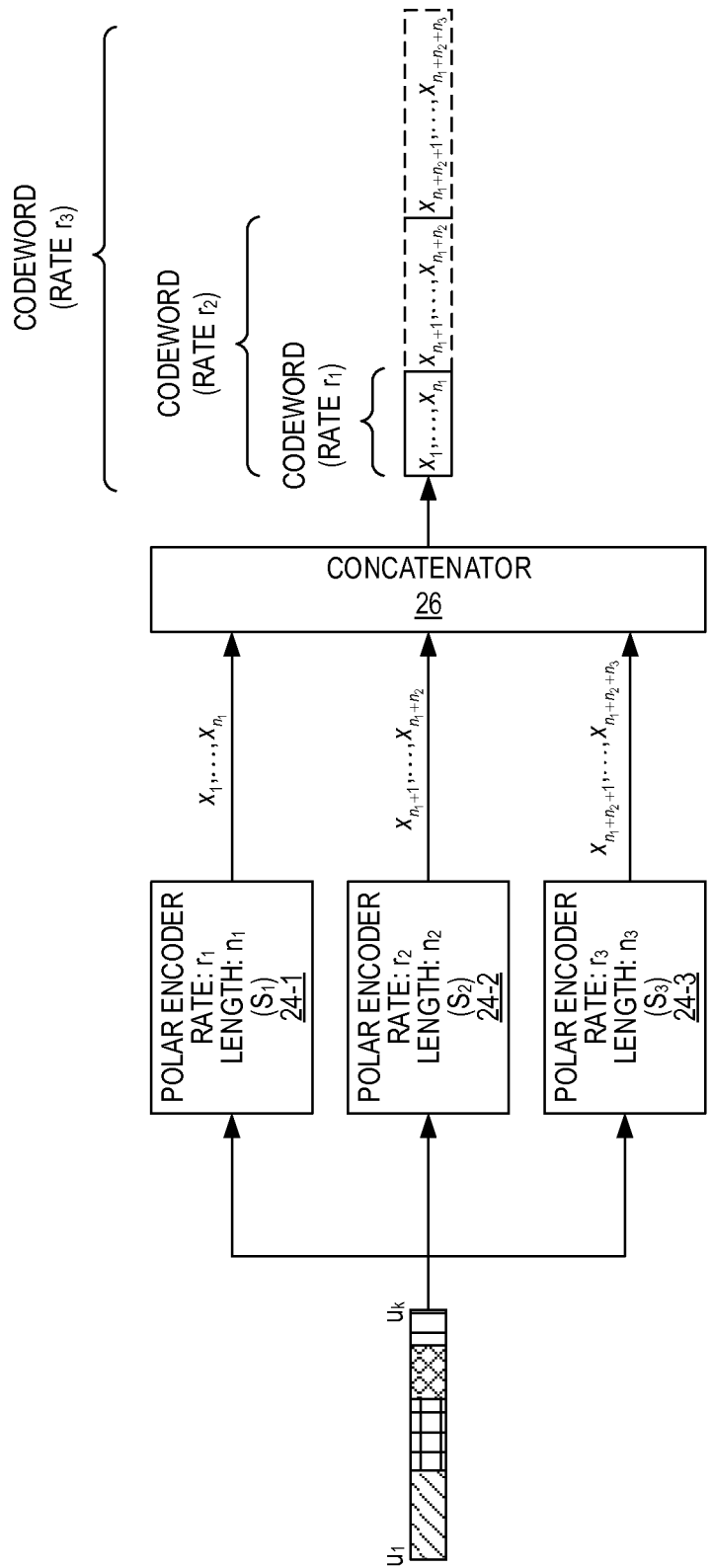
FIGS. 3 and 4 illustrate embodiments of the rate-compatible polar encoder of the transmit node of FIG. 1 according to some embodiments of the present disclosure.
Figure 4:
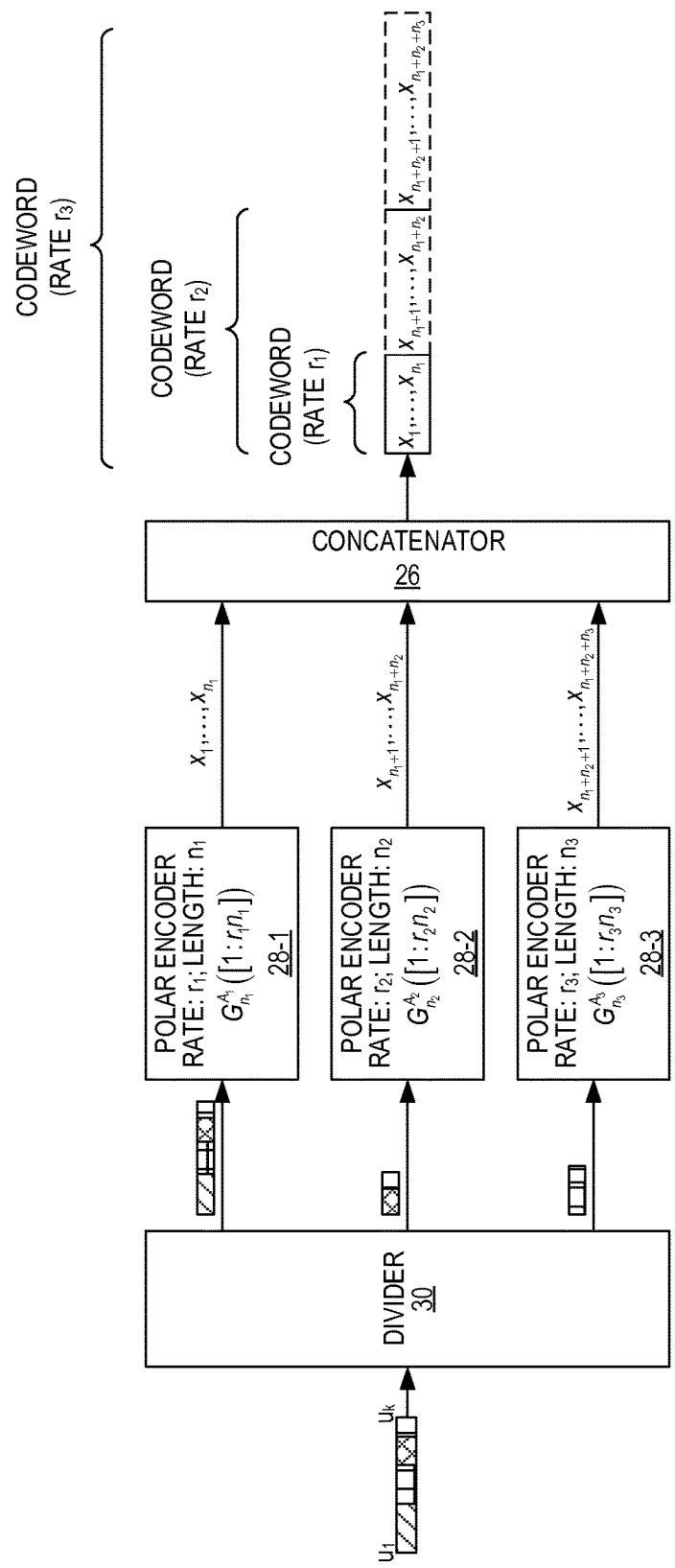

FIGS. 3 and 4 illustrate two example embodiments of the rate-compatible polar encoder 14 of FIG. 1. In these examples, the rate-compatible polar encoder 14 operates to provide rate-compatible polar encoding of the k information bits $(u_1, \ldots, u_k)$ based on the example generator matrix $G_{mother}$ described above for code rates $r_1$, $r_2$, and $r_3$. However, one of ordinary skill in the art will readily appreciate that the embodiments of FIGS. 3 and 4 can readily be extended for the general case of code rates $r_1, \ldots, r_T$.

As illustrated in FIG. 3, the rate-compatible polar encoder 14 includes a number of polar encoders 24-1 through 24-3 (generally referred to herein collectively as polar encoders 24 and individually as polar encoder 24) that operate in parallel to encode the k information bits $(u_1, \ldots, u_k)$ to provide corresponding sets of coded bits for code rates $r_1$, $r_2$, and $r_3$, respectively. Specifically, the polar encoder 24-1 encodes the k information bits $(u_1, \ldots, u_k)$ for code rate $r_1$ to provide $n_1$ coded bits $(x_1, \ldots, x_{n_1})$ according to:

$(u_1, \ldots, u_k)S_1 = (x_1, \ldots, x_{n_1})$.

The polar encoder 24-2 encodes the k information bits $(u_1, \ldots, u_k)$ for code rate $r_2$ to provide $n_2$ coded bits $(x_{n_1+1}, \ldots, x_{n_1+n_2})$ according to:

$(u_1, \ldots, u_k)S_2 = (x_{n_1+1}, \ldots, x_{n_1+n_2})$.

Notably, as discussed above, due to the design of $S_2$, only $r_2 n_2$ of the k information bits $(u_1, \ldots, u_k)$ are actually encoded by the polar encoder 24-2. Similarly, the polar encoder 24-3 encodes the k information bits $(u_1, \ldots, u_k)$ for code rate $r_3$ to provide $n_3$ coded bits $(x_{n_1+n_2+1}, \ldots, x_{n_1+n_2+n_3})$ according to:

$(u_1, \ldots, u_k)S_2 = (x_{n_1+n_2+1}, \ldots, x_{n_1+n_2+n_3})$.

Notably, as discussed above, due to the design of $S_3$, only $r_3 n_3$ of the k information bits $(u_1, \ldots, u_k)$ are actually encoded by the polar encoder 24-3.

In this example, the rate-compatible polar encoder 14 also includes a concatenator 26 that operates to concatenate the coded bits, or polar codes, output by the polar encoders 24-1 through 24-3 to provide the final coded bits, or codeword, output by the rate-compatible polar encoder 14. Note that, depending on the particular implantation, a desired code rate $r_1$ can be achieved in different manners. For example, in one example embodiment, only the polar encoders 24 needed for the desired code rate $r_1$ are active. For instance, if the desired code rate is $r_2$ only the polar encoders 24-1 and 24-2 are active and, as a result, the output of the concatenator 26 consists of the coded bits $(x_1, \ldots, x_{n_1+n_2})$, which is a polar code of length $n_1+n_2$. In another example embodiment, all of the polar encoders 24 are active, but the concatenator 26 is controlled to output only those bits need for the desired code rate. Thus, for example, if the desired code rate is $r_2$, the polar encoders 24-1, 24-2, and 24-3 are active, but the concatenator 26 is controlled such that the output of the concatenator 26 consists of the coded bits $(x_1, \ldots, x_{n_1+n_2})$. As a final example, if all of the polar encoders 24 are active, the concatenator 26 outputs the codeword for code rate $r_3$ (which is a polar code, or mother polar code, of length $n=n_1+n_2+n_3$), and subsequent processing at the transmit node 12 is used to puncture this mother polar code to provide a codeword for the desired code rate.

FIG. 4 illustrates an embodiment of the rate-compatible polar encoder 14 that includes a number of polar encoders 28-1 through 28-3 (generally referred to herein collectively as polar encoders 28 and individually as polar encoder 28) that operate in parallel to encode the appropriate subsets of the k information $(u_1, \ldots, u_k)$ to provide corresponding sets of coded bits for code rates $r_1$, $r_2$, and $r_3$, respectively. Specifically, the polar encoder 28-1 encodes all of the k information bits $(u_1, \ldots, u_k)$ for code rate $r_1$ to provide $n_1$ coded bits $(x_1, \ldots, x_1)$ according to:

$$(u_1, \ldots, u_k) G_{n_1}^{A_1}([1:r_1 n_1]) = (x_1, \ldots, x_{n_1}).$$

The polar encoder 24-2 encodes a subset of $r_2 n_2$ of the k information bits $(u_1, \ldots, u_k)$ for code rate $r_2$ to provide $n_2$ coded bits $(x_{n_1+1}, \ldots, x_{n_1+n_2})$ according to:

$$(u_1, \ldots, u_k) G_{n_2}^{A_2}([1:r_2 n_2]) = (x_{n_1+1}, \ldots, x_{n_1+n_2}).$$

Similarly, the polar encoder 24-3 encodes a subset of $r_3 n_3$ bits of the k information bits $(u_1, \ldots, u_k)$ for code rate $r_3$ to provide $n_3$ coded bits $(x_{n_1+n_2+1}, \ldots, x_{n_1+n_2+n_3})$ according to:

$$(u_1, \ldots, u_k) G_{n_3}^{A_3}([1:r_3 n_3]) = (x_{n_1+n_2+1}, \ldots, x_{n_1+n_2+n_3}).$$

Notably, $$G_{n_3}^{A_3}([1:r_3 n_3]) = \begin{bmatrix} G_{n_3}^{A_3}([1:r_3 n_{(3,1)}]) \\ G_{n_3}^{A_3}([r_3 n_{(3,1)}+1:r_3 n_{(3,1)}+r_3 n_{(3,2)}]) \end{bmatrix}.$$

In this example, the rate-compatible polar encoder 14 also includes a divider 30 that operates to divide the k information bits $(u_1, \ldots, u_k)$ into appropriate subsets to be encoded by the polar encoders 28. In particular, in this example, the divider 30 provides all of the k information bits $(u_1, \ldots, u_k)$ to the polar encoder 28-1, which then encodes the k information bits $(u_1, \ldots, u_k)$ at the code rate $r_1$ to provide the $n_1$ coded bits $(x_1, \ldots, x_{n_1})$. In this example, the divider 30 provides the last $r_2 n_2$ bits of the k information bits to the polar encoder 28-2, which then encodes those $r_2 n_2$ information bits at the code rate $r_2$ to provide the $n_2$ coded bits $(x_{n_1+1}, \ldots, x_{n_1+n_2})$. Further, in this example, the divider 30 provides $r_3 n_3$ bits of the k information bits to the polar encoder 28-3, which then encodes those $r_3 n_3$ information bits at the code rate $r_3$ to provide the $n_3$ coded bits $(x_{n_1+n_2+1}, \ldots, x_{n_1+n_2+n_3})$. In this particular example, the $r_3 n_3$ information bits provided to the polar encoder 28-3 include $r_3 n_{(3,1)}$ information bits starting at $u_{r_3 n_1+1}$ and the last $r_3 n_{(3,2)}$ information bits. Notably, while not illustrated, in some embodiments, the divider 30 may apply any desired mapping (e.g., identity mapping or reverse mapping) of the bits in the appropriate subsets of the k information bits to the input bit locations of the polar encoders 28.

As discussed above with respect to the example of FIG. 3, the rate-compatible polar encoder 14 of FIG. 4 also includes the concatenator 26 that operates to concatenate the coded bits output by the polar encoders 28-1 through 28-3 to provide the final coded bits, or codeword, output by the rate-compatible polar encoder 14. As discussed above, depending on the particular implementation, a desired code rate $r_i$ can be achieved in different manners. For example, in one example embodiment, only the polar encoders 28 needed for the desired code rate $r_i$ are active. For instance, if the desired code rate is $r_2$, only the polar encoders 28-1 and 28-2 are active and, as a result, the output of the concatenator 26 consists of the coded bits $(x_1, \ldots, x_{n_1+n_2})$. In another example embodiment, all of the polar encoders 28 are active, but the concatenator 26 is controlled to output only those bits need for the desired code rate. Thus, for example, if the desired code rate is $r_2$, the polar encoders 28-1, 28-2, and 28-3 are active, but the concatenator 26 is controlled such that the output of the concatenator 26 consists of the coded bits $(x_1, \ldots, x_{n_1+n_2})$. As a final example, if all of the polar encoders 28 are active, the concatenator 26 outputs the codeword for code rate $r_3$, and subsequent processing at the transmit node 12 is used to puncture the codeword for code rate $r_3$ to provide a codeword for the desired code rate.

Figure 5:
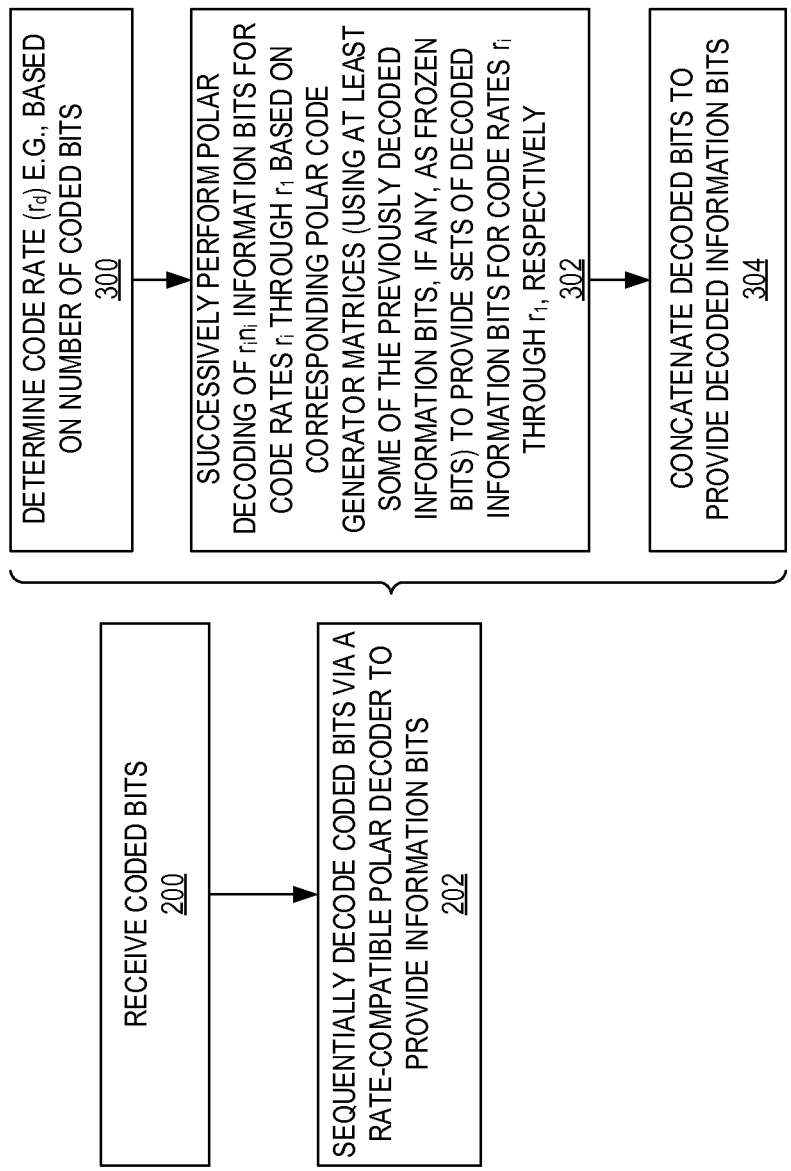
FIG. 5 is a flow chart that illustrates the operation of the receive node of FIG. 1 according to some embodiments of the present disclosure.

Thus far, the discussion has focused on the operation of the transmit node 12 and, in particular, the rate-compatible polar encoder 14. FIG. 5 is a flow chart that illustrates the operation of the receive node 18 to receive the coded bits from the transmit node 12 and to decode the coded bits to recover the information bits according to some embodiments of the present disclosure. As illustrated, the receive node 18 receives the coded bits from the transmit node 12 (step 200). As discussed above, these coded bits are in the form of a polar code generated from a rate-compatible polar code generator matrix, as described above. The receive node 18, and in particular the rate-compatible polar decoder 20, sequentially decodes the coded bits to provide the information bits (step 202). More specifically, the rate-compatible polar decoder 20 determines the code rate $r_d$ of the received coded bits (step 300). The code rate $r_d$ may be determined in any suitable manner. For example, the code rate $r_d$ may be communicated to the receive node 18 from the transmit node 12 or determined from the number of coded bits. Here, $r_d$ is one of the code rates $r_i$. Then, for each code rate $r_i$ in the range of and including $r_d$ to $r_1$, starting with the determined code rate $r_d$, the rate-compatible polar decoder 20 successively performs polar decoding of the corresponding $n_i$ coded bits based on the corresponding polar code generator matrices $G_{n_i}^{A_i}([1:r_i n_i])$ to provide corresponds sets of decoded information bits for the code rates $r_d$ to $r_1$ (step 302). For each iteration of the polar decoding after the first iteration (i.e., for code rates $r_{d-1}$ to $r_1$), at least some of the previously decoded information bits can be utilized as frozen bits for polar decoding to thereby decrease the effective code rate for decoding, as described in the examples below. The sets of decoded information bits for code rates $r_1$ through $r_d$ are then concatenated to provide the decoded information bits (step 304).

A description of the decoding process for a specific case for T=3 is as follows. The extension of this process to the general case is straightforward. For the case where T=3, there are three polar codes whose generator matrices are $G_{n_i}^{Ai}$, respectively. First, the highest code rate (i.e., the polar code for code rate $r_1$) is by itself a polar code with generator matrix $G_{n_1}^{A1}$. Thus, the conventional polar decoder such as SC and SC List (SCL) described in I. Tal et al., "List Decoding of Polar Codes," 2011 IEEE International Symposium on Information Theory Proceedings, pages 1-5, Jul. 31-Aug. 5, 2011 can be used. The polar code for code rate $r_2$ can be considered as parallel concatenation of the two polar codes for code rates $r_1$ and $r_2$, with generator matrices $G_{n_i}^{Ai}$ for i=1, 2, respectively, as discussed above. One efficient decoding procedure for code rate $r_2$ is as follows:

First, the $r_2 n_2 = (r_1 - r_2) n_1$ information bits encoded for code rate $r_2$ (as described above) are decoded using the second polar code with generator matrix $G_{n_2}^{A2}$.

Using the decoded information bits as frozen bits to the first polar code with the generator matrix $G_{n_1}^{A1}$, the resulting code is a polar code of length $n_1$ and code rate $r_2$, where the information set of this polar code is obtained by taking first $r_2 n_1$ elements. That is, inserting frozen bits produces a lower-rate polar code. Then, the $r_2 n_1$ information bits are decoded using this lower-rate polar code.

Using this procedure, two polar decoding iterations result in successful decoding of $(r_1 - r_2) n_1 + r_2 n_1 = k$ information bits. Notice that in the two decoding iterations, two polar codes of code rate $r_2$ are used. Since both achieve the capacity as n goes to infinity, the proposed code can also achieve the capacity.

In the above, a sequential decoding process is described where information bits are decoded by two polar codes sequentially. This approach is optimal by achieving the capacity, when code length goes to infinity. Yet, for a finite code length, other decoding algorithms can be considered such as Belief Propagation (BP) decoding over whole graph induced by two parallel concatenated polar codes.

Next, the decoding procedure is described for code rate $r_3$. In a manner similar to that described above, three sequential polar decoding operations are used to decode the information bits, where, in this example, all polar codes (used in decoding) are of code rate $r_3$.

First, the $r_3 n_3$ information bits encoded for code rate $r_3$ (as described above) are decoded using the polar code of code rate $r_3$ and with generator matrix $G_{n_3}^{A3}$.

Using the some decoded bits as frozen bits to the polar code with generator matrix $G_{n_2}^{A2}$, a polar code of code rate $r_3$ is produced. Then, the $r_3 n_2$ information bits (i.e., the remaining information bits of the $r_2 n_2$ information bits encoded for code rate $r_2$ after excluding the frozen bits) are decoded using this polar code of code rate $r_3$.

Using the all decoded bits (i.e., the union of all decoded bits from the previous decoding operations) as frozen bits to the polar code with the generator matrix $G_{n_1}^{A1}$, the resulting code is a polar code of code rate $r_3$ and length $n_1$. Using this polar code, the remaining $r_3 n_1$ information bits are decoded. At this point, all information bits are decoded.

In other words, the successive decoding procedure can be explained as follows. Assuming that the sequential decoding procedure begins with code rate $r_T$ (but may alternatively start at any desired code rate $r_d$), the subset of information bits carried by the $n_T$ coded bits at the code rate $r_T$ (e.g., the last retransmission in the case of HARQ-IR) is first decoded. The resulting decoded information bits are used as frozen bits to decode the subset of the information bits carried by the $n_{T-1}$ coded bits. Notably, this stage of polar coding/decoding is originally designed for code rate $r_{T-1}$, but due to the use of the previously decoded information bits as frozen bits, the code rate of this polar decoding is effectively reduced to $r_T$ as well. Then, the union of the two sets of information bits resulting from the two previous polar decodes is used as frozen bits for the next stage of polar decoding, where the subset of information bits carried by the $n_{T-2}$ coded bits are decoded. This stage of polar decoding is originally designed for code rate $r_{T-2}$, but due to the use of the previously decoded information bits as frozen bits, the code rate of this polar decoding is effectively reduced to $r_T$ as well. The process continues in this manner until all of the information bits have been decoded.

Figure 6A:
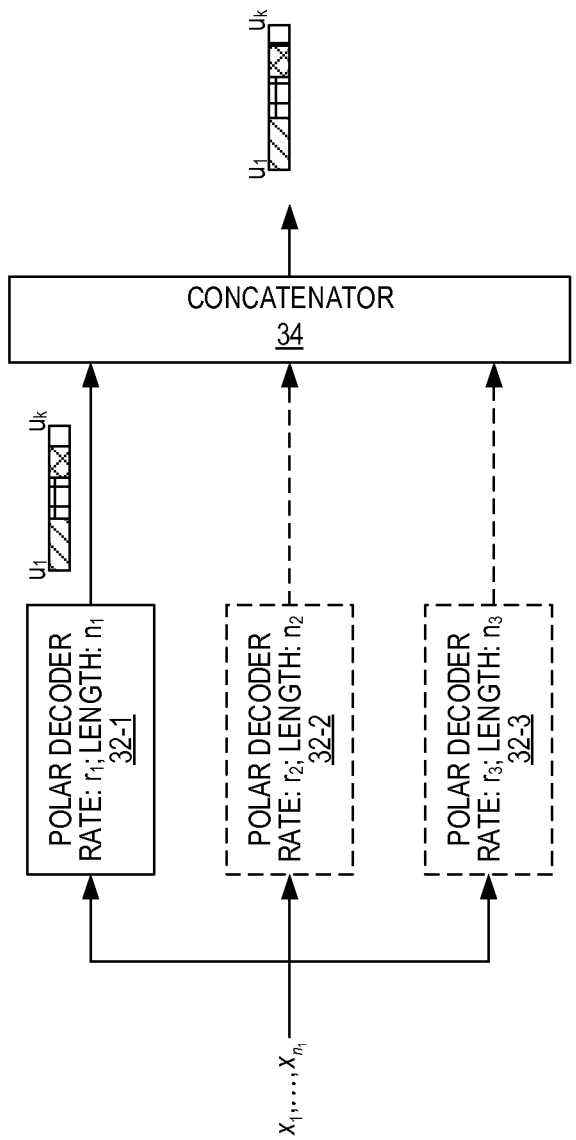
FIGS. 6A through 6C illustrate an embodiment of the rate-compatible polar decoder of the receive node of FIG. 1 according to some embodiments of the present disclosure.
Figure 6B:
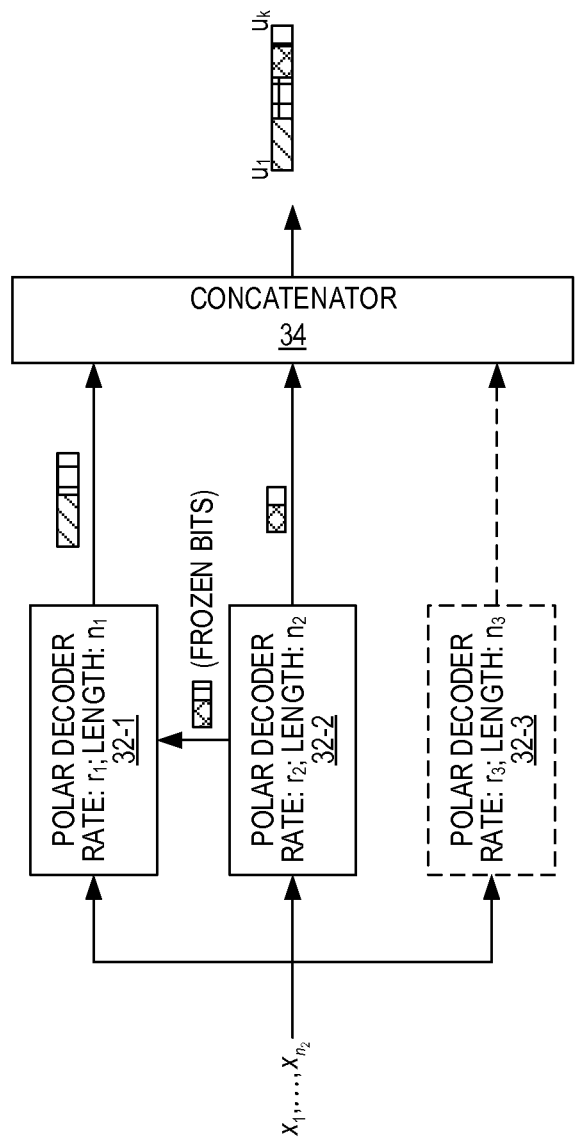
Figure 6C:
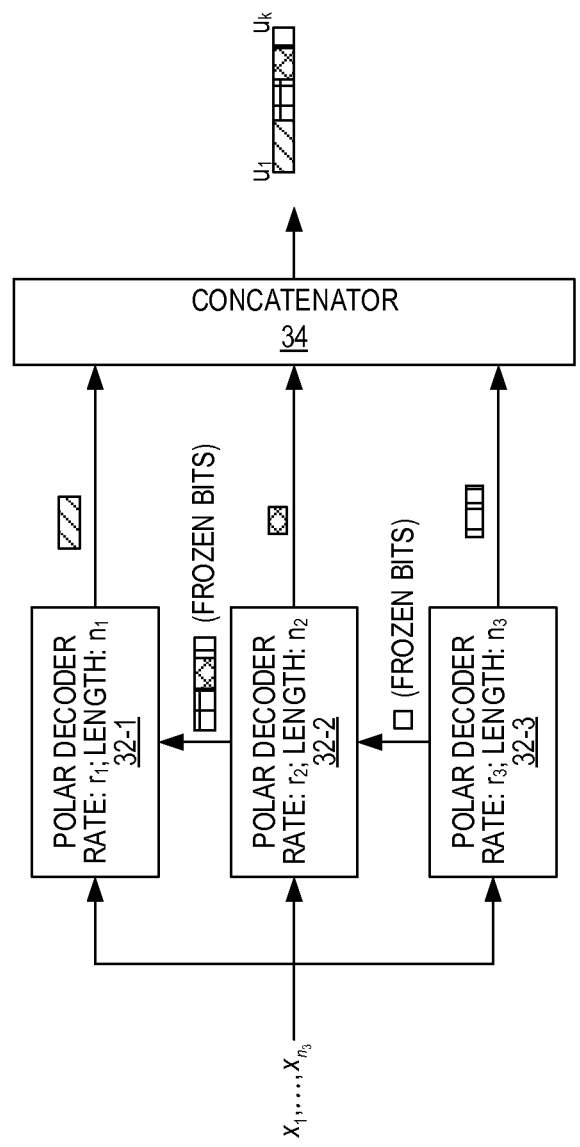

FIGS. 6A through 6C illustrate an example embodiment of the rate-compatible polar decoder 20 operating according to the process of FIG. 5. In particular, FIG. 6A illustrates the operation of the rate-compatible polar decoder 20 when decoding for code rate $r_1$, FIG. 6B illustrates the operation of the rate-compatible polar decoder 20 when decoding for code rate $r_2$, and FIG. 6C illustrates the operation of the rate-compatible polar decoder 20 when decoding for code rate $r_3$. As illustrated in FIG. 6A, the coded bits are encoded at a code rate $r_1$ and have a length $n_1$. As such, a polar decoder 32-1 for code rate $r_1$ and length $n_1$ is used to perform polar decoding using the polar code with generator matrix $G_{n_1}^{A1}$ of code rate $r_1$.

As illustrated in FIG. 6B, the coded bits are encoded at a code rate $r_2$ and have a length $n_1 + n_2$. In this case, a polar decoder 32-2 for code rate $r_2$ and length $n_2$ decodes the $r_2 n_2$ information bits encoded at code rate $r_2$ (as discussed above). The decoded information bits are provided to the polar decoder 32-1 as frozen bits. The polar decoder 32-1 uses the frozen bits for the first polar code with generator matrix $G_{n_1}^{A1}$, to provide a resulting polar code of length $n_1$ and code rate $r_2$. Using this resulting lower-rate polar code, the polar decoder 32-1 decodes the remaining $r_2 n_1$ information bits. A concatenator 34 concatenates the decoded sets of information bits output by the polar decoders 32-1 and 32-2 to provide the final set of k information bits $n_1$ coded bits $(u_1, \ldots, u_k)$.

In FIG. 6C, the coded bits received by the receive node 18 are encoded at a code rate $r_3$ and have a length $n_1 + n_2 + n_3$. In this case, a polar decoder 32-3 for code rate $r_3$ and length $n_3$ decodes the $r_3 n_3$ information bits encoded at code rate $r_3$ (as discussed above). Some of the decoded information bits (i.e., those information bits that were also encoded at code rate $r_2$) are provided to the polar decoder 32-2 as frozen bits. The polar decoder 32-2 uses the frozen bits for the second polar code with generator matrix $G_{n_2}^{A2}$ to provide a resulting polar code of length $n_2$ and code rate $r_3$. Using this resulting lower-rate polar code, the polar decoder 32-2 decodes the remaining $r_3 n_2$ information bits (of the $r_2 n_2$ information bits encoded at code rate $r_2$). Lastly, in this example, all of the previously decoded information bits are provided to the polar decoder 32-1 as frozen bits. The polar decoder 32-1 uses the frozen bits for the first polar code with generator matrix $G_{n_1}^{A1}$ to provide a resulting polar code of length $n_1$ and code rate $r_3$. Using this resulting lower-rate polar code, the polar decoder 32-1 decodes the remaining $r_3 n_1$ information bits. At this point, all k information bits are decoded.

The concatenator 34 concatenates the decoded sets of information bits output by the polar decoders 32-1 through 32-3 to provide the final set of k information bits $n_1$ coded bits $(u_1, \ldots, u_k)$.

As one example, encoding and decoding can be performed as follows. This is only an example and is not to be construed as limiting the scope of the present disclosure. Consider a rate-compatible polar code with $3 \cdot 2^m$ (for some positive integer m) information bits (i.e., $k=3 \cdot 2^m$) and code rates (3/4, 1/2, 1/4) (i.e., $\{r_i|i=1, \ldots, 3\}=\{3/4, 1/2, 1/4\}$). For the encoding, the following polar codes may be employed by the polar encoders 24, 28:

Encoder 1 (polar encoder 24-1, 28-1): polar code of code rate 3/4 and length $2^{m+2}$;
  Encoder 2 (polar encoder 24-2, 28-2): polar code of code rate 1/2 and length $2^{m+1}$; and
  Encoder 3 (polar encoder 24-3, 28-3): polar code of code rate 1/4 and length $2^{m+2}$.

For the decoding, the following polar codes can be employed by the polar decoders 32:

code rate 3/4: polar decoder (polar decoder 32-1) of code rate 3/4 and length $2^{m+2}$;
  code rate 1/2: using two polar codes:
    Decoder 1: polar decoder (polar decoder 32-2) of code rate 1/2 and length $2^{m+1}$; and
    Decoder 2: polar decoder (polar decoder 32-1) of code rate 1/2 and length $2^{m+2}$; and
  code rate 1/4: using three polar codes in FIG. 3:
    Decoder 1: polar decoder (polar decoder 32-3) of code rate 1/4 and length $2^{m+2}$;
    Decoder 2: polar decoder (polar decoder 32-2) of code rate 1/4 and length $2^{m+1}$; and
    Decoder 3: polar decoder (polar decoder 32-3) of code rate 1/4 and length $2^{m+2}$.

Figure 7:
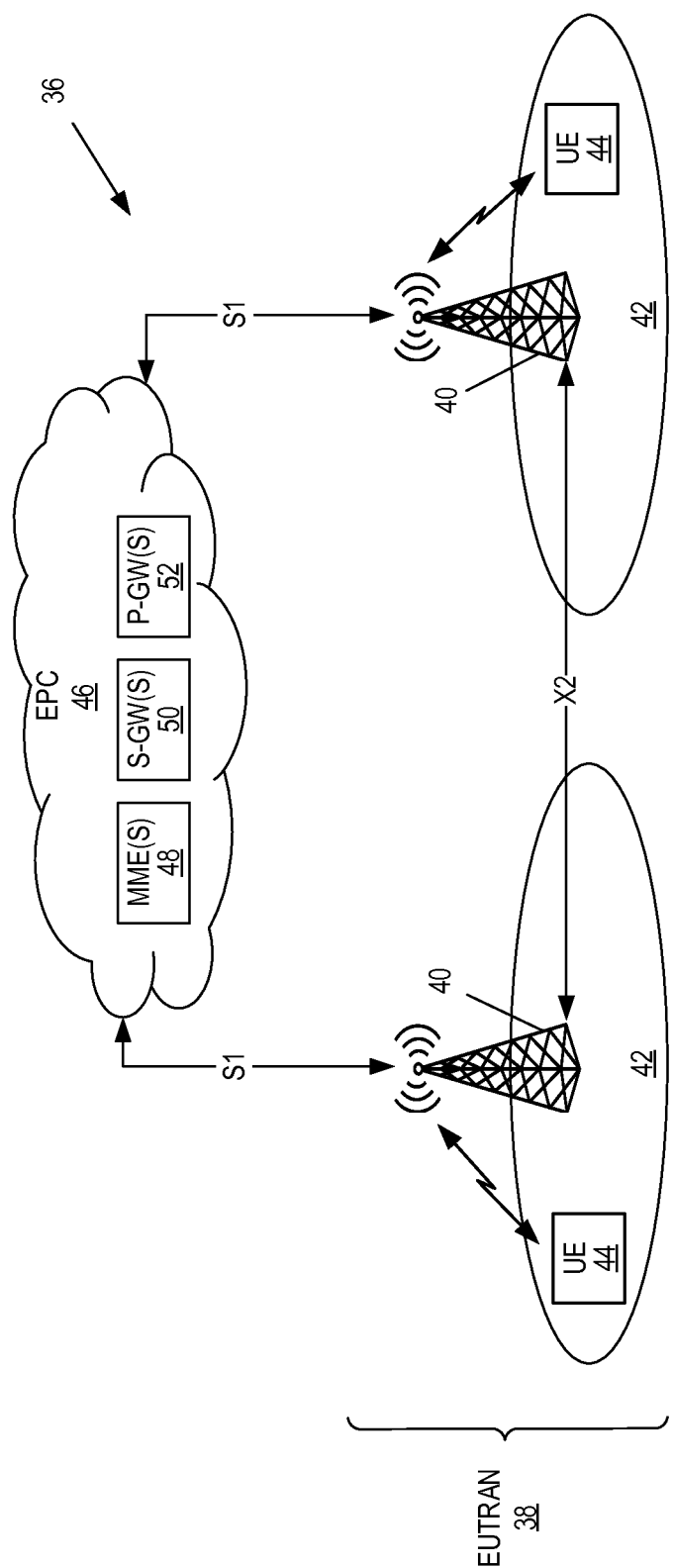
FIG. 7 illustrates a cellular communications network in which rate-compatible polar codes are utilized according to some embodiments of the present disclosure.

The transmit node 12 and the receive node 18 described above may be implemented in any suitable type of wireless communications system 10. In this regard, FIG. 7 illustrates a cellular communications network 36 including wireless nodes (e.g., Radio Access Network (RAN) nodes and/or wireless devices or terminals) that implement the rate-compatible polar encoder 14 and/or the rate-compatible polar decoder 20 according to some embodiments of the present disclosure. Further, as described below, the rate-compatible generator matrix $G_{mother}$ may, in some embodiments, be used for HARQ-IR transmissions/retransmissions.

In this example, the cellular communications network 36 is a Long Term Evolution (LTE) network and, as such, LTE terminology is sometimes used. However, the cellular communications network 36 is not limited to LTE. As illustrated, the cellular communications network 36 includes a Evolved Universal Terrestrial Radio Access Network (EUTRAN) 38 including enhanced or evolved Node Bs (eNBs) 40 (which may more generally be referred to herein as base stations) serving corresponding cells 42. User Equipment devices (UEs) 44 (which may more generally be referred to herein as wireless devices) transmit signals to and receive signals from the eNBs 40. The eNBs 40 communicate with one another via an X2 interface. Further, the eNBs 40 are connected to a Evolved Packet Core (EPC) 46 via S1 interfaces. As will be understood by one of ordinary skill in the art, the EPC 46 includes various types of core network nodes such as, e.g., Mobility Management Entities (MMEs) 48, Serving Gateways (S-GWs) 50, and Packet Data Network Gateways (P-GWs) 52.

In some embodiments, the transmit node 12 is the eNB 40 and the receive node 18 is the UE 44. In other embodiments, the transmit node 12 is the UE 44 and the receive node 18 is the eNB 40. In other words, the eNBs 40 may include the rate-compatible polar encoder 14 and the transmitter 16 of the transmit node 12 of FIG. 1 and/or the rate-compatible polar decoder 20 and the receiver 22 of the receive node 18 of FIG. 1. Likewise, the UEs 44 may include the rate-compatible polar encoder 14 and the transmitter 16 of the transmit node 12 of FIG. 1 and/or the rate-compatible polar decoder 20 and the receiver 22 of the receive node 18 of FIG. 1.

Figure 8:
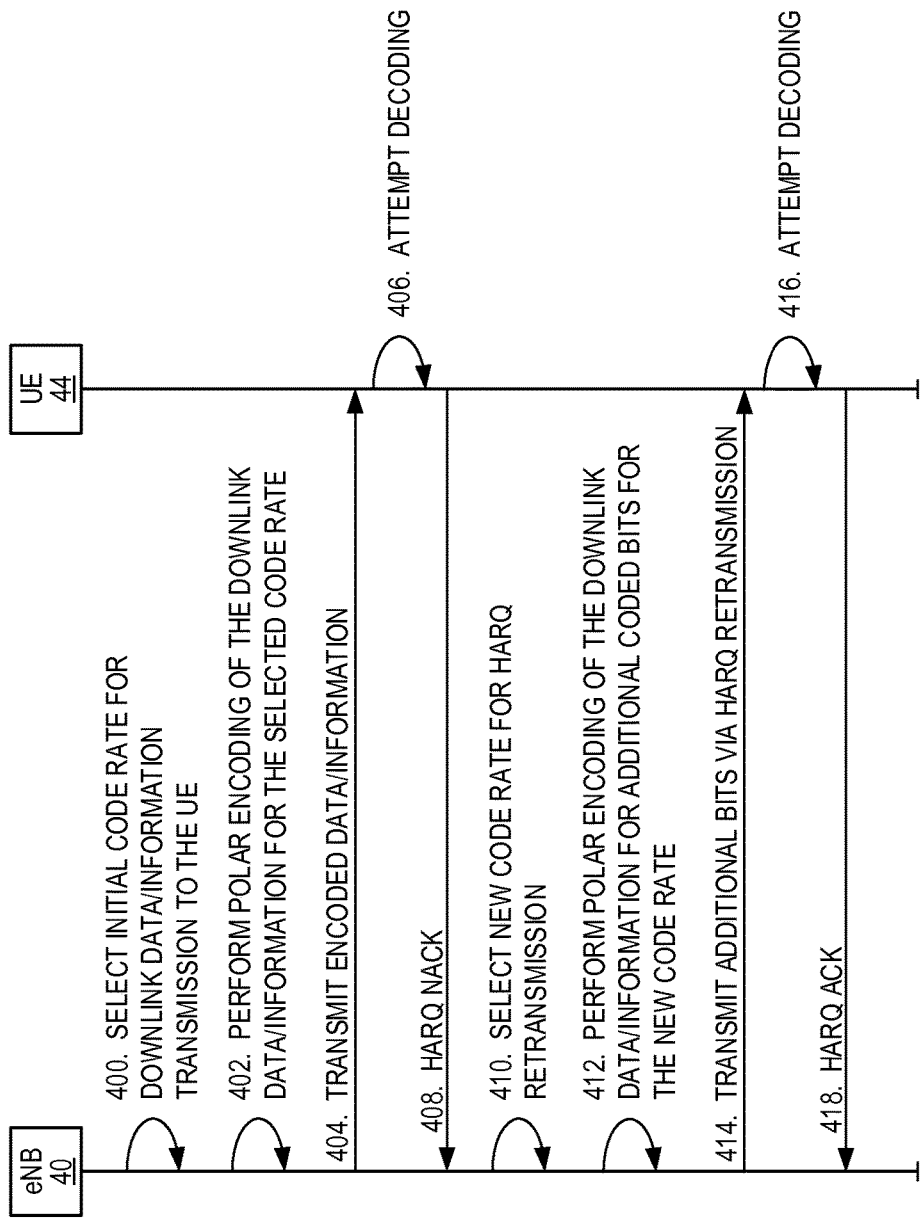
FIG. 8 illustrates a Hybrid Automatic Repeat Request (HARQ) based on Incremental Redundancy (HARQ-IR) process implemented in the cellular communications network of FIG. 7 that utilizes rate-compatible polar codes according to some embodiments of the present disclosure.

As mentioned above, the generator matrix $G_{mother}$ described above can be utilized for HARQ-IR. In this regard, FIG. 8 illustrates the operation of one of the eNBs 40 to transmit k information bits to the UE 44 using HARQ-IR according to some embodiments of the present disclosure. A similar process may be used to transmit k information bits from the UE 44 to the eNB 40 using a HARQ-IR procedure. As illustrated, the eNB 40 selects an initial code rate for downlink data transmission to the UE 44 (i.e., an initial code rate for transmission of k information bits) (step 400). The initial code rate is one of the code rates $r_i$. In this example, it is assumed that the initial code rate is the highest code rate $r_1$, but the initial code rate is not limited thereto. The eNB 40, and in particular the rate-compatible polar encoder 14 of the eNB 40, performs polar encoding of the downlink data (i.e., the k information bits) for the initial code rate based on the appropriate submatrices of the generator matrix $G_{mother}$, as described above (step 402). Assuming that the initial code rate is $r_1$, then polar encoding of the k information bits is performed according to the generator matrix $G_{n_1}^{A_1}([1:r_1n_1])$. The coded bits are then transmitted to the UE 44 (step 404). The UE 44 attempts to decode the received coded bits (step 406). In this example, decoding is unsuccessful and, as a result, the UE 44 transmits a HARQ Negative Acknowledgement (NACK) to the eNB 40 (step 408).

Upon receiving the HARQ NACK, the eNB 40 selects a new code rate for a HARQ, or more specifically HARQ-IR, retransmission (step 410) and performs polar encoding of the downlink data (i.e., the k information bits) to provide the additional coded bits to transform the coded bits for the initial code rate into coded bits for the new code rate (step 412). For example, if the initial code rate is $r_1$ and the new code rate is $r_2$, then the polar encoding of step 412 encodes the $r_2 n_2$ information bits using the generator matrix $G_{n_2}^{A_2}([1:r_2n_2])$ (or equivalently encodes the k information bits using $S_2$) to provide the $n_2$ coded bits needed to transform the $n_1$ coded bits for code rate $r_1$ into $n_1 + n_2$ coded bits for code rate $r_2$. The $n_2$ coded bits are transmitted to the UE 44 (step 414). As another example, if the initial code rate is $r_1$ and the new code rate is $r_3$, then the polar encoding of step 414 encodes the $r_2 n_2$ information bits using the generator matrix $G_{n_2}^{A_2}([1:r_2n_2])$ (or equivalently encodes the k information bits using $S_2$) to provide the $n_2$ coded bits and encodes the $r_3 n_3$ information bits using the generator matrix $G_{n_3}^{A_3}([1:r_3n_3])$ (or equivalently encodes the k information bits using $S_3$) to provide the $n_3$ coded bits. The $n_2 + n_3$ coded bits are then transmitted in step 414. Notably, while the polar encoding of step 412 is illustrated as being separate from that of step 402, the polar encoding of steps 402 and 412 may be performed in a single polar encoding process that generates the mother polar code from the mother generator matrix. This mother polar code can then be punctured to provide the different subsets of the encoded bits $x_1, \ldots, x_n$ for transmission in steps 404 and 414 for the initial code rate and new code rate, respectively.

In this example, the UE 44 attempts decoding using the additional coded bits received in step 414 (step 416). In particular, the UE 44 performs sequential polar decoding of the $r_i n_i$ information bits starting at the new code rate, as described above with respect to FIGS. 5 and 6A-6C. In this example, decoding is successful and, as such, the UE 44 transmits a HARQ Acknowledgement (ACK) to the eNB 40 (step 418).

Figure 9:
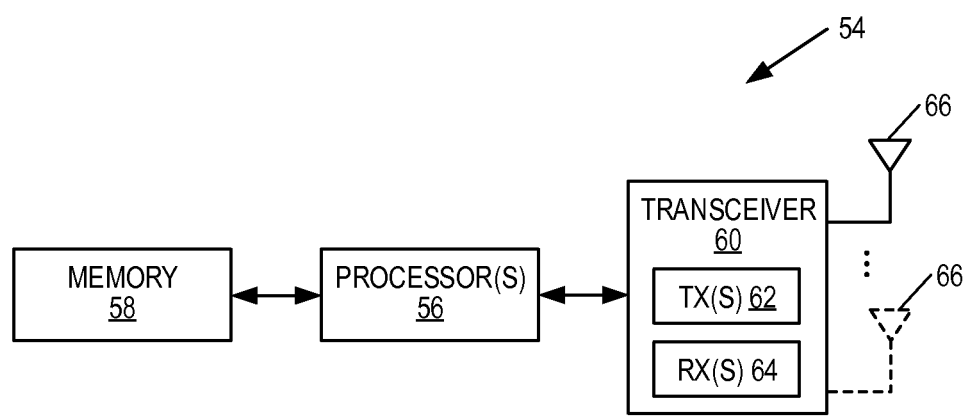
FIG. 9 is a block diagram of a communication node according to some embodiments of the present disclosure.

FIG. 9 illustrates a communication node 54 that includes the rate-compatible polar encoder 14 and/or the rate-compatible polar decoder 20 according to some embodiments of the present disclosure. The communication node 54 may be, for example, the transmit node 12, the receive node 18, the eNB 40, or the UE 44 described above. As illustrated, the communication node 54 includes one or more processors 56 (e.g., one or more Central Processing Units (CPUs), one or more Application Specific Integrated Circuits (ASICs), one or more Field Programmable Gate Arrays (FPGAs), or the like). In some embodiments, the rate-compatible polar encoder 14 and/or the rate-compatible polar decoder 20 are implemented in hardware or a combination of hardware and software within the one or more processors 56 (e.g., implemented as software executed by the one or more processors 56). The communication node 54 also includes memory 58, which may be used to, e.g., store software instructions executed by the processor(s) 56 and/or store other data or information. The communication node 54 also include a transceiver 60, which includes a transmitter(s) 62 and receiver(s) 64 coupled to one or more antennas 66. The transmitter(s) 62 and the receiver(s) 64 include components such as, for example, amplifiers, filters, mixers, etc.

In some embodiments, a computer program including instructions which, when executed by at least one processor, causes the at least one processor to carry out at least some of the functionality of the rate-compatible polar encoder 14 and/or the rate-compatible polar decoder 20 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as the memory 58).

The following acronyms are used throughout this disclosure.

| | |
|---|---|
| 5G | 5$^{th}$ Generation |
| ACK | Acknowledgement |
| ASIC | Application Specific Integrated Circuit |
| BP | Belief Propagation |
| CPU | Central Processing Unit |
| CRC | Cyclic Redundancy Check |
| eNB | Enhanced or Evolved Node B |
| EPC | Evolved Packet Core |
| EUTRAN | Evolved Universal Terrestrial Radio Access Network |
| FPGA | Field Programmable Gate Array |
| HARQ | Hybrid Automatic Repeat Request |
| HARQ-IR | Hybrid Automatic Repeat Request based on Incremental Redundancy |
| IR | Incremental Redundancy |
| LDPC | Low-Density Parity-Check |
| LTE | Long Term Evolution |
| ML | Maximum-Likelihood |
| MME | Mobility Management Entity |
| NACK | Negative Acknowledgement |
| P-GW | Packet Data Network Gateway |
| RAN | Radio Access Network |
| RX | Receive |
| SC | Successive Cancellation |
| SCL | Successive Cancellation List |
| S-GW | Serving Gateway |
| TX | Transmit |
| UE | User Equipment |

Those skilled in the art will recognize improvements and modifications to the embodiments of the present disclosure. All such improvements and modifications are considered within the scope of the concepts disclosed herein and the claims that follow.

What is claimed is:

1. A transmit node operable for use in a wireless communications system, comprising:
   a rate-compatible polar encoder operable to encode a plurality of information bits at a plurality of different code rates and to concatenate output bits produced at one or more of the plurality of different code rates to provide a plurality of coded bits at a desired code rate; and
   a transmitter operable to transmit the plurality of coded bits.

2. The transmit node of claim 1 wherein the rate-compatible polar encoder comprises:
   a plurality of polar encoders, each operable to encode the plurality of information bits at one of the plurality of different code rates, the plurality of polar encoders comprising:
      a first polar encoder operable to encode the plurality of information bits at a first code rate $r_1$ to provide a number $n_1$ of coded bits, where $n_1 = k/r_1$ and k is the number of information bits in the plurality of information bits; and
      a second polar encoder operable to encode a subset of the plurality of information bits at a second code rate $r_2$ to provide a number $n_2$ of coded bits, where $r_1 > r_2$ and the number $n_2$ of coded bits is a number of coded bits that, when concatenated with the number $n_1$ of coded bits, transforms a resulting code word from the first code rate $r_1$ to the second code rate $r_2$;
   wherein the plurality of coded bits provided at the desired code rate $r_{desired}$ are a concatenation of coded bits output by polar encoders of the plurality of polar encoders for the code rates $r_1$ through $r_{desired}$.

3. The transmit node of claim 2 wherein the rate-compatible polar encoder further comprises a concatenator operable to concatenate the coded bits output by the polar encoders for the code rates $r_1$ through $r_{desired}$ to provide the plurality of coded bits at the desired code rate $r_{desired}$.

4. The transmit node of claim 1 wherein the rate-compatible polar encoder comprises:
   a plurality of polar encoders operable to encode the plurality of information bits based on corresponding polar code generator matrices for code rates $r_i$ and lengths $n_i$, where:
      i = {1, ..., T}, where T is a positive integer greater than or equal to 2;
      $n_1$ is a length for code rate $r_1$ and, for all other values of i, $n_i$ is a number of additional coded bits to transform a code word for code rate $r_{i-1}$ into a code word for code rate $r_i$, i.e., $$n_i = \begin{cases} \dfrac{k}{r_i}, & \text{for } i = 1 \\ \dfrac{k}{r_i} - \sum_{j=1}^{i-1} n_j, & \text{for } i > 1 \end{cases}$$

where k is the number of information bits in the plurality of information bits;

$\sum_{i=1}^{T} n_i = n$, where n is a maximum code word length of the plurality of coded bits (i.e., $n=k/n_T$); and $r_i > r_{i+1}$ for $i=1, \ldots, T-1$;

wherein the plurality of coded bits provided at the desired code rate $r_{desired}$ are a concatenation of coded bits output by polar encoders of the plurality of polar encoders for the code rates $r_1$ through $r_{desired}$.

5. The transmit node of claim 4 wherein the rate-compatible polar encoder further comprises a concatenator operable to concatenate outputs of the plurality of polar encoders to provide the plurality of coded bits at the desired code rate $r_{desired}$ such that, for the desired code rate $r_{desired}$, the plurality of coded bits is a concatenation of the outputs of the plurality of polar encoders for the code rates $r_1, \ldots, r_{desired}$.

6. The transmit node of claim 4 wherein the polar code generator matrices for the plurality of polar encoders are submatrices $G_{n_i}^{A_i}([1:r_i n_i])$ of row-permuted generator matrices of i-th polar codes $G_{n_i}^{A_i}$ consisting of rows 1 through $r_i n_i$ of $G_{n_i}^{A_i}$.

7. The transmit node of claim 6 wherein the plurality of polar encoders comprises:
a first polar encoder for code rate $r_1$ operable to encode the plurality of information bits at the code rate $r_1$ to provide $n_1$ coded bits; and
one or more additional polar encoders, each additional polar encoder operable to encode a subset of the plurality of information bits consisting of a number $r_i n_i$ of the plurality of information bits at the code rate $r_i$ to provide $n_i$ coded bits.

8. The transmit node of claim 7 wherein, for each of the one or more additional polar encoders, the subset of the plurality of information bits encoded by the additional polar encoder is different than the subsets encoded by the other additional polar encoders.

9. The transmit node of claim 7 wherein, for each of the one or more additional polar encoders, the subset of the plurality of information bits encoded by the additional polar encoder comprises a predefined number of the plurality of information bits that are most unreliable with respect to transmission of the number $n_1$ of coded bits from the first polar encoder.

10. The transmit node of claim 7 wherein, for at least one of the one or more additional polar encoders, an ordering of the subset of the plurality of information bits encoded by the at least one of the one or more additional polar encoders is different than an ordering of those same information bits when encoded by the first polar encoder.

11. The transmit node of claim 1 further comprising:
at least one processor; and
memory containing instructions executable by the at least one processor whereby the transmit node is further operable to:
select an initial code rate;
perform, via the rate-compatible polar encoder, polar encoding of the plurality of information bits at the initial code rate;
transmit, via the transmitter, the plurality of coded bits, having been encoded at the initial code rate;
upon receiving a negative acknowledgement from a receive node for the transmission of the plurality of coded bits, select a new code rate for an incremental redundancy retransmission;
perform, via the rate-compatible polar encoder, polar encoding of some of the plurality of information bits to provide additional coded bits for the new code rate; and
transmit, via the transmitter, the additional coded bits.

12. The transmit node of claim 11 wherein the rate-compatible polar encoder comprises:
a plurality of polar encoders operable to encode the plurality of information bits based on corresponding polar code generator matrices for code rates $r_i$ and lengths $n_i$, where:
$i=\{1, \ldots, T\}$, where T is a positive integer greater than or equal to 2;
$n_1$ is a length for code rate $r_1$ and, for all other values of i, $n_i$ is a number of additional coded bits to transform a code word for rate $r_{i-1}$ into a code word for code rate $r_i$, i.e., $$n_i = \begin{cases} \dfrac{k}{r_i}, & \text{for } i=1 \\ \dfrac{k}{r_i} - \sum_{j=1}^{i-1} n_j, & \text{for } i>1 \end{cases}$$

where k is a number of information bits in the plurality of information bits;
$\sum_{i=1}^{T} n_i = n$, where n is a maximum code word length of the plurality of coded bits (i.e., $n=k/n_T$); and
$r_i > r_{i+1}$ for $i=1, \ldots, T-1$;
wherein the plurality of coded bits are provided at an initial code rate $r_{initial}$ and are a concatenation of coded bits output by polar encoders of the plurality of polar encoders for the code rates $r_1$ through $r_{initial}$.

13. The transmit node of claim 12 wherein the rate-compatible polar encoder further comprises a concatenator operable to selectively concatenate outputs of the plurality of polar encoders to provide the plurality of coded bits at the initial code rate $r_{initial}$ such that, for the initial code rate $r_{initial}$, the plurality of coded bits is a concatenation of the outputs of the plurality of polar encoders for the code rates $r_1, \ldots, r_{initial}$.

14. The transmit node of claim 12 wherein the additional coded bits for a new code rate $r_{new}$ are a concatenation of the outputs of the plurality of polar encoders for the code rates $r_{initial+1}, \ldots, r_{new}$, where $r_{new} \leq r_{initial+}$.

15. A method of operation of a transmit node in a wireless communications system, comprising:
encoding a plurality of information bits at a plurality of different code rates via a plurality of polar code generator matrices to produce coded bits at the plurality of different code rates;
concatenating the coded bits produced at one or more of the plurality of different code rates to provide a plurality of coded bits at a desired code rate; and
transmitting the plurality of coded bits.

16. The method of claim 15 wherein encoding the plurality of information bits comprises:
encoding the plurality of information bits via a first polar code generator matrix at a first code rate $r_1$ to provide a number $n_1$ of coded bits, where $n_1=k/r_1$ and k is a number of information bits in the plurality of information bits; and
encoding a subset of the plurality of information bits via a second polar code generator matrix at a second code rate $r_2$ to provide a number $n_2$ of coded bits, where $r_1 > r_2$ and the number $n_2$ of coded bits is a number of coded bits that, when concatenated with the number $n_1$ of coded bits, transforms a resulting code word from the first code rate $r_1$ to the second code rate $r_2$, wherein concatenating the coded bits produced at the one or more of the plurality of different code rates comprises selectively concatenating the number $n_1$ of coded bits and the number $n_2$ of coded bits to provide the plurality of coded bits at the desired code rate.

17. The method of claim 15 wherein encoding the plurality of information bits comprises:
encoding the plurality of information bits based on the plurality of polar code generator matrices for code rates $r_i$ and lengths $n_i$, where:
i={1, ... , T}, where T is a positive integer greater than or equal to 2;
$n_1$ is a length for code rate $r_1$ and, for all other values of i, $n_i$ is a number of additional coded bits to transform a code word for code rate $r_{i-1}$ into a code word for code rate $r_i$, i.e., $$n_i = \begin{cases} \frac{k}{r_i}, & \text{for } i = 1 \\ \frac{k}{r_i} - \sum_{j=1}^{i-1} n_j, & \text{for } i > 1 \end{cases}$$

where k is a number of information bits in the plurality of information bits;
$\Sigma_{i=1}^{T} n_i = n$, where n is a maximum code word length of the plurality of coded bits (i.e., $n = k/r_T$); and
$r_i > r_{i+1}$ for i=1, ..., T-1; and
wherein concatenating the coded bits produced at the one or more of the plurality of different code rates comprises selectively concatenating sets of coded bits resulting from encoding the plurality of information bits based on the plurality of polar code generator matrices for the code rates $r_i$ and the lengths $n_i$ to provide the plurality of coded bits at the desired code rate $r_{desired}$ such that, for the desired code rate $r_{desired}$, the plurality of coded bits is a concatenation of the sets of coded bits resulting from encoding the plurality of information bits based on the plurality of polar code generator matrices for the code rates $r_1, \ldots r_{desired}$.

18. The method of claim 17 wherein the polar code generator matrices are submatrices $G_{n_i}^{A_i}([1:r_i n_i])$ of row-permuted generator matrices of i-th polar codes $G_{n_i}^{A_i}$ consisting of rows 1 through $r_i n_i$ of $G_{n_i}^{A_i}$.

19. The method of claim 15 further comprising:
selecting an initial code rate; and
performing the encoding of the plurality of information bits at the initial code rate;
wherein transmitting the plurality of coded bits comprises transmitting the plurality of coded bits, having been encoded at the initial code rate.

20. The method of claim 19 further comprising:
upon receiving a negative acknowledgement from a receive node for the transmission of the plurality of coded bits, selecting a new code rate for an incremental redundancy retransmission;
performing polar encoding of some of the plurality of coded bits to provide additional coded bits for the new code rate; and
transmitting the additional coded bits.

21. The method of claim 20 wherein performing the encoding of the plurality of information bits at the initial code rate comprises:
encoding the plurality of information bits based on corresponding polar code generator matrices for code rates $r_i$ and lengths $n_i$, where:

i={1, ... , INITIAL}, where INITIAL is an index of the initial code rate and is a positive integer greater than or equal to 1;
$n_1$ is a length for code rate $r_1$ and, for all other values of i, $n_i$ is a number of additional coded bits to transform a code word for code rate $r_{i-1}$ into a code word for code rate $r_i$, i.e., $$n_i = \begin{cases} \frac{k}{r_i}, & \text{for } i = 1 \\ \frac{k}{r_i} - \sum_{j=1}^{i-1} n_j, & \text{for } i > 1 \end{cases}$$

where k is the number of information bits in the plurality of information bits;
$r_i > r_{i+1}$; and
concatenating sets of coded bits resulting from encoding the plurality of information bits based on the corresponding polar code generator matrices for the code rates $r_i$ and the lengths $n_i$ for i={1, ... , INITIAL} to provide the plurality of coded bits at the initial code rate.

22. The method of claim 21 wherein the additional coded bits for a new code rate $r_{new}$ are a concatenation of one or more sets of coded bits resulting from encoding at least some of the plurality of information bits based on corresponding polar code generator matrices for code rates $r_i$ and lengths $n_i$ for i={INITIAL+1, ... , NEW}, where NEW is an index of the new code rate $r_{new}$.

23. A receive node operable for use in a wireless communications system, comprising:
a receiver operable to receive a plurality of polar encoded bits; and
a rate-compatible polar decoder operable to determine a code rate $r_d$ of the plurality of polar encoded bits and to decode the plurality of polar encoded bits according to the determined code rate to provide a plurality of information bits.

24. The receive node of claim 23 wherein, in order to decode the plurality of polar encoded bits, the rate-compatible polar decoder is operable to:
determine the code rate $r_d$ of the plurality of polar encoded bits, the code rate $r_d$ being one of a predefined set of code rates $\{r_i\}_{i=1, \ldots, T}$ where $r_i > r_{i+1}$ for i=1, ..., T-1 and T is a positive integer greater than or equal to 2;
successively perform polar decoding of a last $n_i$ polar encoded bits of the plurality of polar encoded bits for code rates $r_d$ to $r_1$ to provide sets of information bits for the code rates $r_d$ to $r_1$, respectively, where:

$$n_i = \begin{cases} \frac{k}{r_i}, & \text{for } i = 1 \\ \frac{k}{r_i} - \sum_{j=1}^{i-1} n_j, & \text{for } i > 1 \end{cases} ;$$

k is a number of information bits encoded into the plurality of polar encoded bits; and
$r_i > r_{i+1}$ for i=1, ..., T, where $r_T$ is a lowest code rate; and
concatenate the sets of information bits for the code rates $r_d$ to $r_1$ to provide the plurality of information bits.

25. The receive node of claim 24 wherein, in order to successively perform polar decoding of the last $n_i$ polar encoded bits of the plurality of polar encoded bits for the code rates $r_d$ to $r_1$ to provide the sets of information bits for the code rates $r_d$ to $r_1$, respectively, the rate-compatible polar decoder is further operable to:
- perform polar decoding of a last $n_d$ polar encoded bits of the plurality of polar encoded bits for the code rate $r_d$ to provide the set of information bits for the code rate $r_d$;
- perform polar decoding of a next $n_{d-}$ polar encoded bits of the plurality of polar encoded bits using the set of information bits for the code rate $r_d$ as frozen bits to provide the set of information bits for code rate $r_{d-1}$; and
- perform polar decoding of a next $n_{d-2}$ polar encoded bits of the plurality of polar encoded bits using a union of the sets of information bits for code rates $r_d$ and $r_{d-}$ as frozen bits to provide the set of information bits for code rate $r_{d-2}$.

* * * * *